United States Patent
Tsutada et al.

(10) Patent No.: US 8,093,885 B2
(45) Date of Patent: Jan. 10, 2012

(54) RESIDUAL MAGNETIC FLUX DETERMINING APPARATUS

(75) Inventors: Hiroyuki Tsutada, Tokyo (JP); Takashi Hirai, Tokyo (JP); Haruhiko Kohyama, Tokyo (JP); Kenji Kamei, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 375 days.

(21) Appl. No.: 12/094,677

(22) PCT Filed: Jan. 31, 2006

(86) PCT No.: PCT/JP2006/301546
§ 371 (c)(1),
(2), (4) Date: Sep. 15, 2009

(87) PCT Pub. No.: WO2007/088588
PCT Pub. Date: Aug. 9, 2007

(65) Prior Publication Data
US 2010/0013470 A1  Jan. 21, 2010

(51) Int. Cl.
*G01P 3/48* (2006.01)
(52) U.S. Cl. ............... 324/166; 324/207.25; 324/207.23; 324/160
(58) Field of Classification Search .................. None
See application file for complete search history.

(56) References Cited

U.S. PATENT DOCUMENTS

| 7,535,234 B2 * | 5/2009 | Mernyk et al. | 324/536 |
|---|---|---|---|
| 7,696,648 B2 * | 4/2010 | Kinoshita et al. | 307/125 |
| 2004/0124814 A1 | 7/2004 | Tsutada et al. | |

FOREIGN PATENT DOCUMENTS

| JP | 2 179220 | 7/1990 |
|---|---|---|
| JP | 8 065882 | 3/1996 |
| JP | 11 162769 | 6/1999 |
| JP | 2000 275311 | 10/2000 |
| JP | 2003-232840 | 8/2003 |
| JP | 2003 232840 | 8/2003 |
| JP | 2005-204368 | 7/2005 |

OTHER PUBLICATIONS

Extended European Search Report issued Sep. 23, 2010, in European Patent Application No. 06712689.6.

\* cited by examiner

*Primary Examiner* — Roberto Velez
*Assistant Examiner* — Trung Nguyen
(74) *Attorney, Agent, or Firm* — Oblon, Spivak, McClelland, Maier & Neustadt, L.L.P.

(57) ABSTRACT

A residual magnetic flux measurement apparatus measures residual magnetic fluxes by using a transformer-voltage measurement means for measuring transformer voltages; a voltage delay means for delaying the measured signals; a DC-voltage-component calculation means for calculating DC voltage components from the latest transformer-voltage signals for a predetermined time period based on calculation-control signals; a voltage integration means for calculating voltage-integration signals by performing voltage integration of signals obtained after separating the DC voltage components from present transformer-voltage signals; a magnetic-flux DC-component calculation means for calculating magnetic-flux DC-components from the latest voltage-integration signals for a predetermined time period based on the calculation-control signals; a magnetic flux calculation means for obtaining magnetic flux signals in which the magnetic-flux DC-components are separated from present voltage-integration signals; and a control means for obtaining residual magnetic fluxes based on contact signals, an interruption mode, the transformer-voltage signals, and the magnetic flux signals.

5 Claims, 4 Drawing Sheets

RESIDUAL MAGNETIC FLUX DETERMINING APPARATUS

TECHNICAL FIELD

The present invention relates to residual magnetic flux measurement apparatus for three-phase transformers.

BACKGROUND ART

In a conventional residual magnetic flux measurement apparatus, a magnetic flux waveform is obtained by measuring a voltage waveform from a transformer and by performing integral calculation thereof; then, a residual magnetic flux is given by subtracting the mean value of the maximum value and the minimum value of the magnetic flux waveform as a correction term of direct-current component (for example, refer to Patent Document 1).

In addition, in another conventional residual magnetic flux measurement apparatus, a magnetic flux waveform is obtained by measuring a voltage waveform from a transformer and by performing integral calculation thereof; at this time, by obtaining the difference between the final value of the magnetic flux waveform and the center value of sinusoidal oscillation before interrupting an electric power source, a residual magnetic flux is given (for example, refer to Patent Document 2).

[Patent Document 1] Japanese Laid-Open Patent Publication No. H02-179220

[Patent Document 2] Japanese Laid-Open Patent Publication No. 2000-275311

DISCLOSURE OF THE INVENTION

Problems to be Solved by the Invention

In a conventional residual magnetic flux measurement apparatus, it is premised upon fluctuations of transformer voltages and residual magnetic fluxes that only occur before and after interrupting a three-phase transformer. However, when a transformer circuit-breaker is mounted with interelectrode capacitors, not only before and after the interruption, but also during the state of interruption by the transformer circuit-breaker, there is a case in which a power-system fault or the like occurs resulting in a large fluctuation generated in electric power source's voltages, so that transformer voltages and residual magnetic fluxes may fluctuate by way of the interelectrode capacitors. Even under those conditions, in order to accurately measure the residual magnetic fluxes, it is necessary to measure voltage waveforms of the transformer at all times, and to obtain the residual magnetic fluxes by performing integral calculation. For this reason, in order to accomplish a continuous measurement of the residual magnetic fluxes in a configuration of the conventional residual magnetic flux measurement apparatus, the arrangement results in integrating all of the voltage waveforms from the time immediately before the breaker's interruption until a present time-point so as to obtain final values in magnetic flux waveforms. Consequently, as time passes from an interruption time-point, it is necessary to calculate voltage-integration values for long-time voltage waveforms. In this case, drift is generated in the voltage-integration values owing to fluctuations of direct-current offset components superimposed in the voltage waveforms, so that it is not possible to accurately calculate residual magnetic fluxes as time passes, which has caused a problem. The present invention has been directed at solving those problems described above, and an object of the invention is to measure more accurately the residual magnetic fluxes, even after time passes from an interruption time-point.

Means for Solving the Problems

In one aspect of a residual magnetic flux measurement apparatus in the present invention, the residual magnetic flux measurement apparatus comprises: a DC-voltage-component calculation means for calculating a DC voltage component of a voltage from a three-phase transformer; a voltage integration means for calculating a voltage-integration signal by separating the DC voltage component from the voltage from the three-phase transformer; a magnetic-flux DC-component calculation means for calculating a magnetic-flux DC-component from the voltage-integration signal; a magnetic flux calculation means for calculating a magnetic flux signal by separating the magnetic-flux DC-component from the voltage-integration signal; a control means for stopping, when contacts of circuit breakers on both sides for any one of the phases of the three-phase transformer are interrupted together, an update on the DC voltage component and the magnetic-flux DC-component, and for calculating, when a maximum absolute value of the voltage continues in a state of being a threshold value or less for a predetermined time period, as a residual magnetic flux a total sum of converged values of the magnetic flux signal after the circuit breakers' interruption; and the above means being provided for each phase.

Effects of the Invention

In one aspect of the present invention, a residual magnetic flux measurement apparatus comprises: a DC-voltage-component calculation means for calculating a DC voltage component of a voltage from a three-phase transformer; a voltage integration means for calculating a voltage-integration signal by separating the DC voltage component from the voltage from the three-phase transformer; a magnetic-flux DC-component calculation means for calculating a magnetic-flux DC-component from the voltage-integration signal; a magnetic flux calculation means for calculating a magnetic flux signal by separating the magnetic-flux DC-component from the voltage-integration signal; a control means for stopping, when contacts of circuit breakers on both sides for any one of the phases of the three-phase transformer are interrupted together, an update on the DC voltage component and the magnetic-flux DC-component, and for calculating, when a maximum absolute value of the voltage continues in a state of being a threshold value or less for a predetermined time period, as a residual magnetic flux a total sum of converged values of the magnetic flux signal after the circuit breakers' interruption; and the above means being provided for each phase; thus, even after time passes from an interruption time-point, it is possible to accurately measure residual magnetic fluxes.

EXPLANATION OF NUMERALS AND SYMBOLS

"1" designates an electric power source; "2," three-phase transformer; "3," circuit breaker; "4," voltage transformer; "5," contact signals; "6," transformer-voltage measurement means; "7," measured voltages; "8," transformer-voltage signals; "9," DC-voltage-component calculation means; "10," DC voltage components; "11," voltage integration means; "12," voltage-integration signals; "13," magnetic-flux DC-component calculation means; "14," magnetic-flux DC-components; "15," magnetic flux calculation means; "16," magnetic flux signals; "17," control means; "18," residual magnetic fluxes; "19," calculation-control signals; "21," voltage delay means; "22," interruption mode; "25," measured signals; and "26," circuit breaker.

BEST MODE FOR CARRYING OUT THE INVENTION

Embodiment 1

Figure 1:
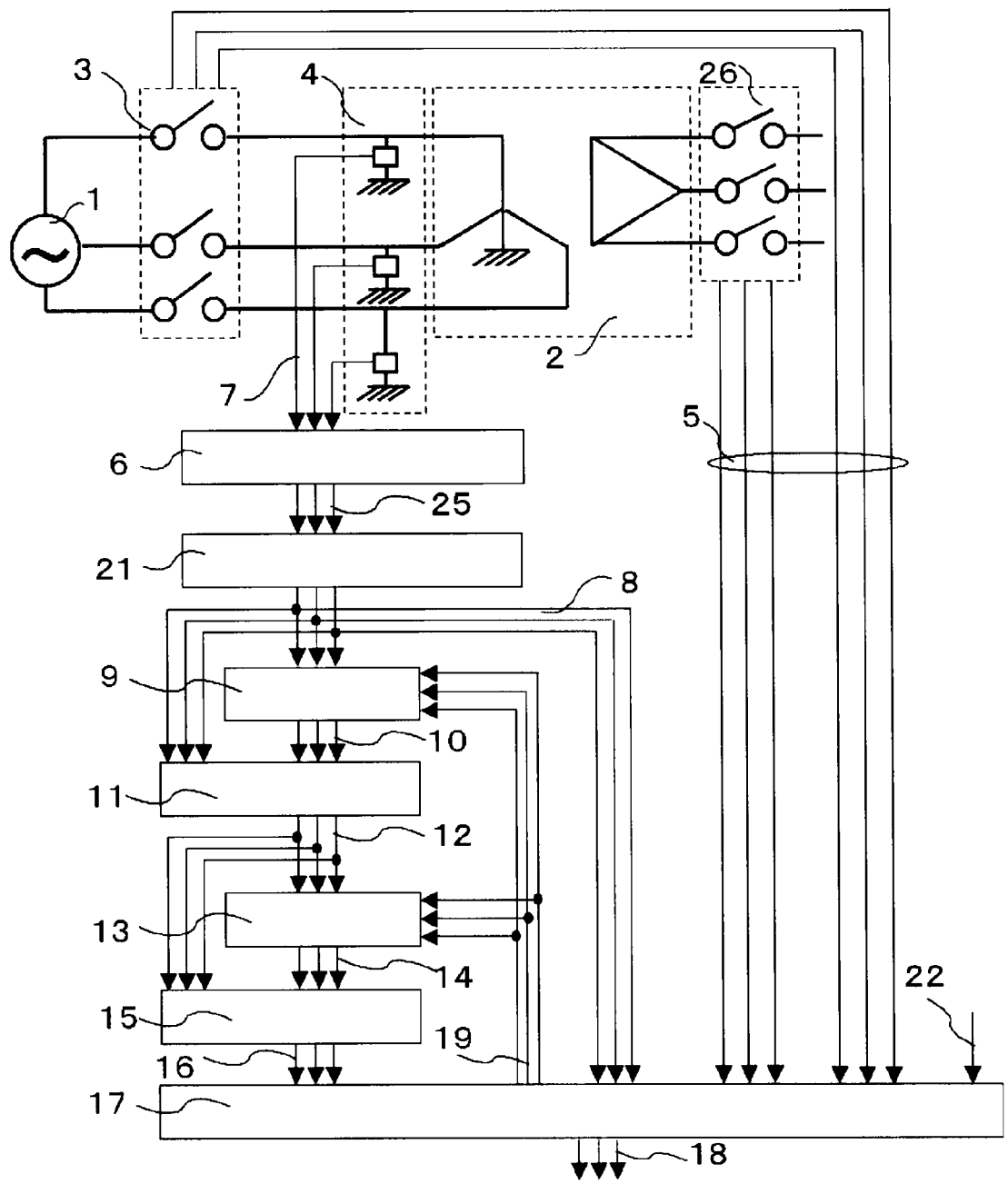
FIG. 1 is a block diagram showing a residual magnetic flux measurement apparatus in Embodiment 1.

FIG. 1 is a block diagram of a residual magnetic flux measurement apparatus illustrating an embodiment of the present invention. A circuit breaker 3 is connected between an electric power source 1 and a three-phase transformer 2, and a circuit breaker 26 is connected to the three-phase transformer 2 on the secondary side thereof. A set of the circuit breaker 3 and the circuit breaker 26 are together referred to as circuit breakers provided on both sides. Transformer voltages are measured via a voltage transformer 4 that is connected to the three-phase transformer 2 on the primary side thereof. It should be noted that, in this embodiment, the voltages of the three-phase transformer 2 are measured by connecting the voltage transformer 4 to the three-phase transformer 2 on the primary side thereof; however, it may be possible to measure the voltages by connecting it to the three-phase transformer 2 on the secondary side thereof, or it may be possible to measure the voltages by connecting it to the three-phase transformer 2 on the tertiary side thereof when tertiary windings exist.

Note that, in the figures, the same reference numerals and symbols designate the same items or corresponding items; this is common to the entire text in the description. In addition, expressions to those constituent elements expressed in the entire text of the description are mainly examples being stated and not limited to those statements.

In a transformer-voltage measurement means 6, measured signals 25 are obtained by performing an A/D conversion (analog-to-digital conversion) at an every predetermined time-interval upon measured voltages 7 obtained via the voltage transformer 4.

A voltage delay means 21 can delay the latest voltages from the three-phase transformer 2 by the amount of given delay time, and outputs, every time the measured signals 25 are obtained at one sampling time, transformer-voltage signals 8 that are delayed by the amount of the given delay time. For example, when the delay time is set as 100 msec, the latest measured signals 25 for 100 msec are stored into a buffer; every time the newest measured signals 25 are obtained, the oldest measured signals 25 in the buffer are then outputted as the transformer-voltage signals 8.

A DC-voltage-component calculation means 9 is provided for calculating DC voltage components of voltages each from the three-phase transformer 2; offset values of the transformer-voltage signals 8 are therefore calculated at every sampling time. The offset values may be calculated as mean values of the latest transformer-voltage signals 8 having been sampled for a predetermined time period including the newest transformer-voltage signals 8, or calculated as values by applying a low-pass filter to the transformer-voltage signals 8 obtained at every sampling time. When calculation-control signals 19 are at an "ON" level, the latest offset values having been obtained through the above calculation are outputted as updated DC voltage components 10. On the other hand, when the calculation-control signals 19 are at an "OFF" level, the DC voltage components 10 at the last time when the calculation-control signals 19 were "ON" are outputted. Namely, when the calculation-control signals 19 are "OFF," outputs of the DC voltage components 10 are sampled and held.

In a voltage integration means 11, every time the newest transformer-voltage signals 8 are obtained at one sampling time, values after subtracting the DC voltage components 10 from the latest (newest) transformer-voltage signals 8 are added to voltage-integration signals 12 at the last sampling time, whereby the newest voltage-integration signals 12 can be obtained. Namely, the voltage integration means 11 separates the DC voltage components 10 from the voltages from the three-phase transformer 2, so that the voltage-integration signals 12 are then calculated.

A magnetic-flux DC-component calculation means 13 is provided for calculating magnetic-flux DC-components 14 from the voltage-integration signals 12; offset values are therefore calculated from the voltage-integration signals 12 at every sampling time. The offset values may be calculated as mean values of the latest voltage-integration signals 12 having been sampled for a predetermined time period including the newest voltage-integration signals 12, or calculated as values by applying a low-pass filter to the voltage-integration signals 12 obtained at every sampling time. And, when the calculation-control signals 19 are "ON," the latest offset values having been obtained through the above calculation are outputted as the updated magnetic-flux DC-components 14. On the other hand, when the calculation-control signals 19 are "OFF," the magnetic-flux DC-components 14 at the last time when the calculation-control signals 19 were "ON" are outputted. Namely, when the calculation-control signals 19 are "OFF," outputs of the magnetic-flux DC-components 14 are sampled and held.

A magnetic flux calculation means 15 is provided for separating the magnetic-flux DC-components 14 from the voltage-integration signals 12 and for calculating magnetic flux signals 16; every time the newest voltage-integration signals 12 are obtained at one sampling time, the magnetic-flux DC-components 14 are subtracted from the newest voltage-integration signals 12, whereby the magnetic flux signals 16 are calculated. Note that, the magnetic flux signals 16 may be normalized so that an amplitude of the magnetic flux signals 16 is made at one unit in a state of nominal supply of transformer voltages.

As described above, in the transformer-voltage measurement means 6, the voltage delay means 21, the DC-voltage-component calculation means 9, the voltage integration means 11, the magnetic-flux DC-component calculation means 13, and the magnetic flux calculation means 15, calculations are performed for each of the phases based on the measured voltages 7 of each phase.

A control means 17 uses the magnetic flux signals 16, the transformer-voltage signals 8 and contact signals 5 that are signals directly related to open and close contact-positions of the circuit breaker 3 and the circuit breaker 26 to transmit the calculation-control signals 19 to the DC-voltage-component calculation means 9 and the magnetic-flux DC-component calculation means 13 so as to take control thereof. In addition, the control means 17 calculates residual magnetic fluxes 18. The control means 17 is informed of an interruption mode 22 that distinguishes whether the interruption is owing to an "ordinary breaker-operation" following an ordinary sequence or owing to a "power-system fault" and the like.

Figure 2:
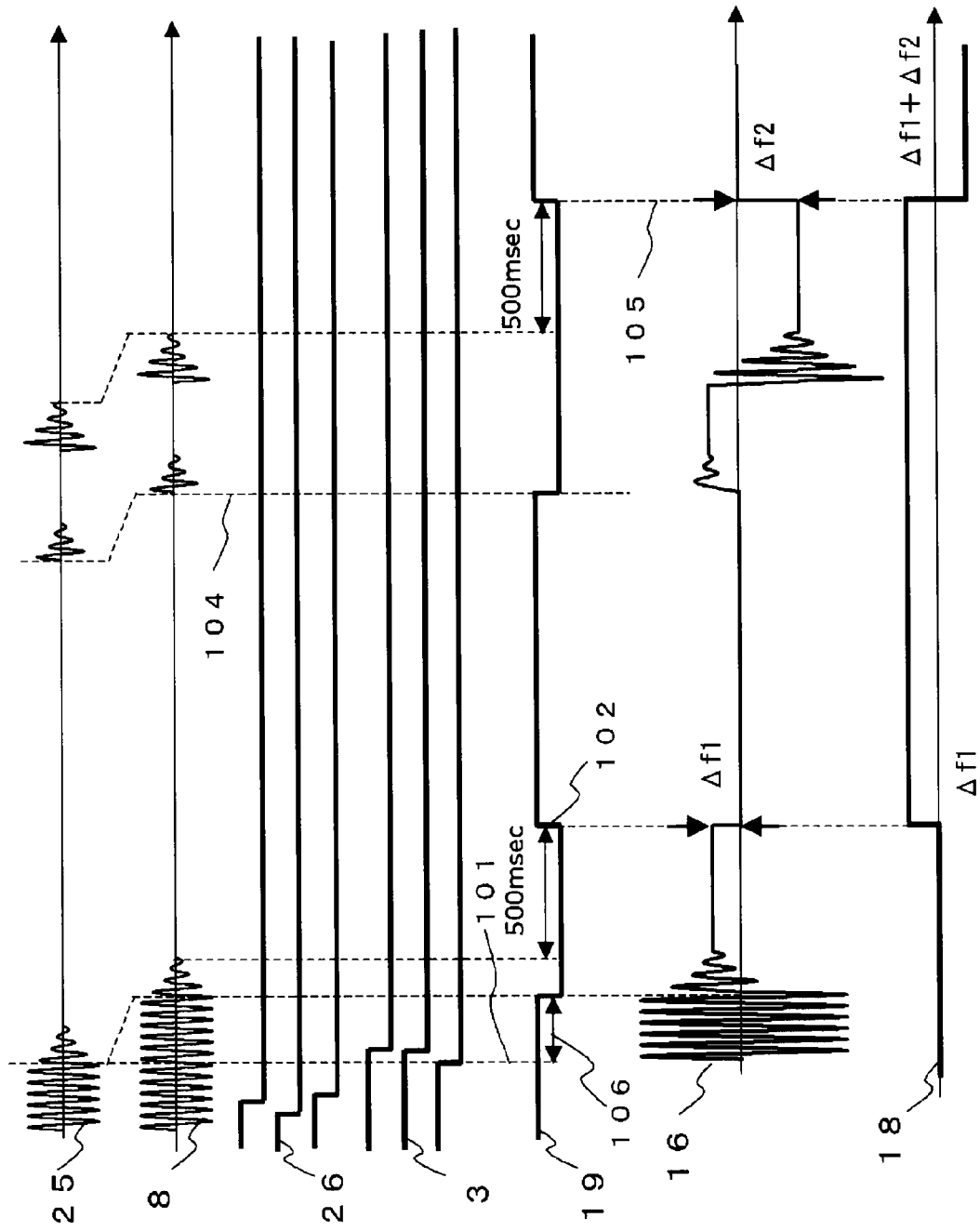
FIG. 2 is a timing diagram showing the operations of the residual magnetic flux measurement apparatus in Embodiment 1.

Next, the operations of the control means 17 will be explained by using FIG. 2. FIG. 2 is a timing diagram showing the operations of the residual magnetic flux measurement apparatus in Embodiment 1. In the figure, with reference to three lines for contact signals from the circuit breaker 26, for three phases, phase-A, phase-B and phase-C from the top, the upper and lower levels denote "ON" and "OFF," respectively. Similarly, also with reference to three lines for contact signals from the circuit breaker 3, for the three phases, phase-A, phase-B and phase-C from the top, the upper and lower levels denote "ON" and "OFF," respectively. In the figure, at the time point indicated by "101," the contact signal in the phase-C of the circuit breaker 3 is switched from "ON" to "OFF." In addition, as for the calculation-control signals 19, the upper and lower levels denote "ON" and "OFF," respectively. In a case of the figure, one of the calculation-control signals 19 is switched from "OFF" to "ON" at the time points indicated by "102" and "105," and switched from "ON" to "OFF" at the time point indicated by "104." In FIG. 2, for brevity of explanation, the explanation has been made for one of the phases; however, it is needless to say that the operations of the other phases are identical to that of the one phase.

The control means 17 detects an open-contact time-point at all times by using the contact signals 5 that are the signals directly related to open and close contact-positions of the circuit breaker 3 and the circuit breaker 26. The open-contact time-point is a time when the circuit breakers, the circuit breaker 3 and the circuit breaker 26, provided on both sides of the three-phase transformer 2 for each phase are initially interrupted for one phase, which is then indicated as a time point at which both of the contact signals from the circuit breaker 3 and the circuit breaker 26 that are the circuit breakers on both sides for one phase turn from "ON" to "OFF" for the first time. For example, in FIG. 2, at the time point 101, the contact signal of the phase-C turns from "ON" to "OFF" for the first time for "both" circuit breakers, the circuit breaker 3 and the circuit breaker 26; therefore, this time point is defined as the open-contact time-point in common among the three phases.

Moreover, the control means 17 detects at all times, in a case in which the circuit breakers, the circuit breaker 3 and the circuit breaker 26, provided on both sides of the three-phase transformer 2 are in open-contact states in all the phases (all the contact signals 5 are "OFF"), a voltage generation time-point that is a time point when an absolute value of the transformer-voltage signals 8 exceeds a threshold value for any one phase. For example, in FIG. 2, at the time point 104 all the contact signals 5 are "OFF" and one of the transformer-voltage signals 8 has exceeded the threshold value, so that the time point is defined as the voltage generation time-point.

In FIG. 2, an example of a case in which the interruption mode 22 is owing to an "ordinary breaker-operation" will be explained. When the open-contact time-point 101 is detected, because the interruption mode 22 is owing to the "ordinary breaker-operation," the calculation-control signals 19 are reset to "OFF" after a given delay time 106 has passed. This is because, by the voltage delay means 21, the transformer-voltage signals 8 are delayed by the delay time with respect to the actual phenomenon having occurred; therefore, after the open-contact time-point 101 having been detected, transient changes occur in the transformer-voltage signals 8 after the delay time has passed. By resetting the calculation-control signals 19 to "OFF," in the DC-voltage-component calculation means 9 and the magnetic-flux DC-component calculation means 13, values of the DC voltage components 10 and the magnetic-flux DC-components 14 are remained fixed at the values immediately before transient voltage changes occur, and the magnetic flux signals 16 are calculated from that time onward.

Next, a detection is performed whether or not a maximum value of an absolute value of the transformer-voltage signals 8 continues in a state of being a threshold value or less for a predetermined time period. Here, as an example, a case in which the predetermined time period is 500 msec will be explained. As indicated in FIG. 2, a time point 102 is then detected when one of the transformer-voltage signals 8 has kept at a threshold value or less over a previous time period of 500 msec. At the time point 102, it is presumed that the magnetic flux signals 16 have converged; therefore, a converged magnetic-flux value $\Delta f1$ that is a converged value of each of the magnetic flux signals 16 at the time point 102 is stored.

Next, the calculation-control signals 19 are set to "ON"; thereby, in the DC-voltage-component calculation means 9 and the magnetic-flux DC-component calculation means 13, updating calculations of the DC voltage components 10 and the magnetic-flux DC-components 14 are restarted, respectively. By controlling the calculation-control signals 19 according to the above, it is possible to reduce calculation errors of the DC voltage components 10 and the magnetic-flux DC-components 14 in time periods in which the transformer-voltage signals 8 transiently change. Note that, the explanation has been carried out by presuming the calculation-control signals 19 for the DC-voltage-component calculation means 9 and the magnetic-flux DC-component calculation means 13 are common; however, it may be possible to individually provide such calculation-control signals, and to configure them in such a manner that time points at which the calculation-control signals 19 return from "OFF" to "ON" differ with each other.

Next, as in FIG. 2, according to one of the transformer-voltage signals 8, the voltage generation time-point 104 is detected. When the voltage generation time-point 104 is detected, the calculation-control signals 19 are immediately reset to "OFF." According to this, in the DC-voltage-component calculation means 9 and the magnetic-flux DC-component calculation means 13, values of the DC voltage components 10 and the magnetic-flux DC-components 14 are remained fixed at the values immediately before transient voltage changes occur, and the magnetic flux signals 16 are calculated from that time onward.

Similarly, in the manner as described before, a time point 105 is then detected at which a maximum value of the absolute value of the transformer-voltage signals 8 continues in a state of being a threshold value or less over the last 500 msec that is a predetermined time period. It is presumed that the magnetic flux signals 16 have converged at the time point 105, so that a converged magnetic-flux value $\Delta f2$ that is a converged value of each of the magnetic flux signals 16 at this time point is stored. Next, the calculation-control signals 19 are set to "ON," and updating calculations of the DC voltage components 10 and the magnetic-flux DC-components 14 are restarted in the DC-voltage-component calculation means 9 and the magnetic-flux DC-component calculation means 13, respectively.

By repeating the processing described above, whenever such a voltage generation time-point 104 is found, a converged magnetic-flux value is additionally stored, so that the residual magnetic fluxes 18 are calculated. Therefore, the residual magnetic fluxes 18 are given by a total sum of converged magnetic-flux values that have been stored since the interruption of the circuit breaker 3 until the present time. The residual magnetic fluxes 18 each at the time point on the far-right end in FIG. 2 are calculated as Δf1+Δf2.

As a result, the control means 17 stops, when contacts of the circuit breakers on both sides for any one of the phases of the three-phase transformer 2 are interrupted together, updating of the DC voltage components 10 and the magnetic-flux DC-components 14, and calculates, when a maximum value of the absolute value of the voltage continues in a state of being a threshold value or less for a predetermined time period, as residual magnetic fluxes each a total sum of converged values of the magnetic flux signals 16 after the circuit breakers have been interrupted. In addition, the control means 17 stops, when contacts of the circuit breakers on both sides for any one of the phases are interrupted together, updating of the DC voltage components 10 and the magnetic-flux DC-components 14 after the delay time has passed.

Moreover, the control means 17 stops, when an absolute value of a voltage in any one phase exceeds a threshold value in a state of all the circuit breakers on both sides being interrupted together, updating of the DC voltage components 10 and the magnetic-flux DC-components 14, and calculates, when a maximum value of the absolute value of the voltage continues in a state of being a threshold value or less for a predetermined time period, as residual magnetic fluxes each a total sum of converged values of the magnetic flux signals 16 after the circuit breakers have been interrupted. According to these, it is possible to accurately measure the residual magnetic fluxes even after time has passed from the interruption time-point.

Figure 3:
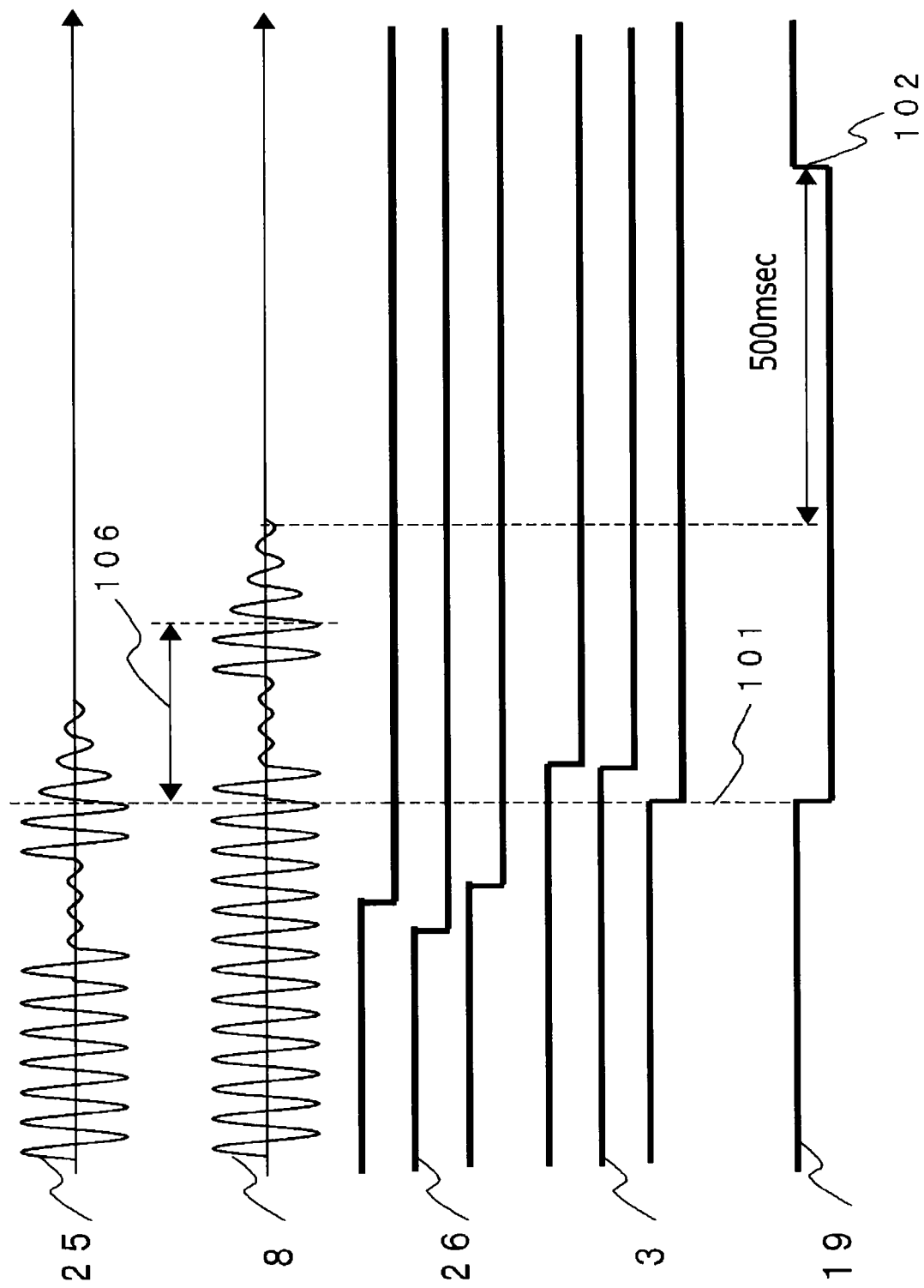
FIG. 3 is another timing diagram showing the operations of the residual magnetic flux measurement apparatus in Embodiment 1.

FIG. 3 is another timing diagram showing the operations of the residual magnetic flux measurement apparatus in Embodiment 1. In the figure, with reference to three lines for contact signals from the circuit breaker 26, for three phases phase-A, phase-B and phase-C from the top, the upper and lower levels denote "ON" and "OFF," respectively. Similarly, also with reference to three lines for contact signals from the circuit breaker 3, for the three phases phase-A, phase-B and phase-C from the top, the upper and lower levels denote "ON" and "OFF," respectively. In the figure, at the time point indicated by "101," the contact signal in the phase-C of the circuit breaker 3 is switched from "ON" to "OFF." In addition, as for the calculation-control signals 19, the upper and lower levels denote "ON" and "OFF," respectively. In a case of the figure, one of the calculation-control signals 19 is switched from "ON" to "OFF" at the time point indicated by "101," and switched from "OFF" to "ON" at the time point indicated by "102."

By using FIG. 3, the operations will be explained in a case in which an open-contact time-point is detected with the interruption mode 22 that is owing to a "power-system fault." When such an open-contact time-point 101 is detected, because the interruption mode 22 is owing to the "power-system fault," the calculation-control signals 19 are immediately reset to "OFF." In comparison to a case in which the interruption mode 22 is owing to an "ordinary breaker-operation" as described before, the time point when the calculation-control signals 19 are reset to "OFF" is different. In a case of a "power-system fault," because of an occurrence of the fault, voltages of the measured signals 25 transiently change before the open-contact time-point to occur. Therefore, by setting a delay time at a value larger than the time period since the occurrence of the fault until the occurrence of the open-contact time-point, and by immediately resetting the calculation-control signals 19 to "OFF" when the open-contact time-point 101 is detected, values of the DC voltage components 10 and the magnetic-flux DC-components 14 are remained fixed at the values immediately before transient voltage changes occur because of an occurrence of the fault, and it is thus possible to calculate the magnetic flux signals 16 from that time onward.

The control means 17 immediately stops, when contacts of the circuit breakers on both sides for any one of the phases of the three-phase transformer 2 are interrupted together and the interruption mode is owing to a "power-system fault," updating of the DC voltage components 10 and the magnetic-flux DC-components 14; therefore, even after time passes from the interruption time-point, it is possible to accurately measure the residual magnetic fluxes.

Figure 4:
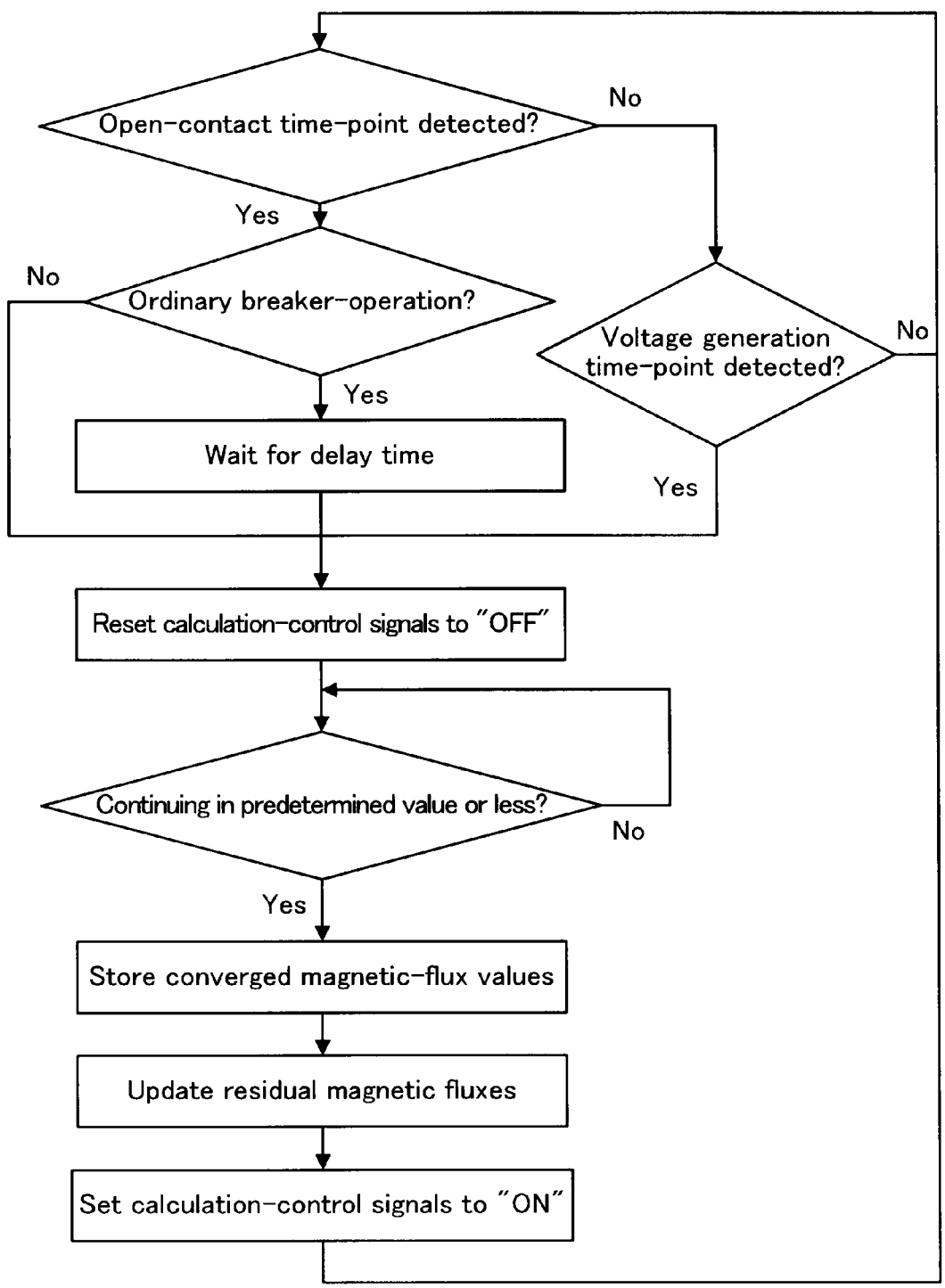
FIG. 4 is a flowchart illustrating the operations of a control means of the residual magnetic flux measurement apparatus in Embodiment 1.

FIG. 4 is a flowchart illustrating the operations of the control means of the residual magnetic flux measurement apparatus in Embodiment 1. First, if an open-contact time-point is detected, the interruption mode 22 is checked; in a case of an "ordinary breaker-operation," after 'waiting' for the delay time, the calculation-control signals 19 are reset to "OFF." In a case other than that, the calculation-control signals 19 are immediately reset to "OFF." Namely, when contacts of the circuit breakers 3 and 26 on both sides for any one of the phases of the three-phase transformer 2 are interrupted together and the interruption mode 22 is owing to a "power-system fault," updating of the DC voltage components 10 and the magnetic-flux DC-components 14 is immediately stopped. In addition, when an open-contact time-point is not detected and in a case in which a voltage generation time-point is detected, the calculation-control signals 19 are immediately reset to "OFF." Next, after waiting until an absolute value of the transformer-voltage signals 8 continues in a state of being a threshold value or less for a predetermined time period, converged magnetic-flux values are stored, and then the residual magnetic fluxes 18 are updated. After completing those described above, the calculation-control signals 19 are again set to "ON," and a sequence of the operations is repeated. By repeating the operations, it is possible to obtain the residual magnetic fluxes 18.

As described above, according to a residual magnetic flux measurement apparatus in the present invention, when the magnetic flux signals 16 are calculated from the measured transformer-voltage signals 8 by using the transformer-voltage signals 8 before and after an occurrence of voltage fluctuations, the DC voltage components 10 and the magnetic-flux DC-components 14 are separated, so that it is possible to more accurately measure the residual magnetic fluxes 18 than before.

What is claimed is:

1. A residual magnetic flux measurement apparatus, comprising:
   a DC-voltage-component calculation device configured to calculate a DC voltage component of a voltage from a three-phase transformer;
   a voltage integration device configured to calculate a voltage-integration signal by separating the DC voltage component from the voltage from the three-phase transformer;

a magnetic-flux DC-component calculation device configured to calculate a magnetic-flux DC-component from the voltage-integration signal;

a magnetic flux calculation device configured to calculate a magnetic flux signal by separating the magnetic-flux DC-component from the voltage-integration signal;

a control device configured to stop, when contacts of circuit breakers on both sides for any one of the phases of the three-phase transformer are interrupted together, an update on the DC voltage component and the magnetic-flux DC-component, and to calculate, when a maximum absolute value of the voltage continues in a state of being a threshold value or less for a predetermined time period, as a residual magnetic flux a total sum of converged values of the magnetic flux signal after the circuit breakers' interruption; and the above devices being provided for each phase.

2. The residual magnetic flux measurement apparatus as set forth in claim 1, further comprising for each phase a voltage delay device configure to delay the latest voltage from the three-phase transformer by a given delay time; wherein the control device is configured to stop, when contacts of the circuit breakers on both sides for any one of the phases are interrupted together and after the delay time has passed, an update on the DC voltage component and the magnetic-flux DC-component.

3. The residual magnetic flux measurement apparatus as set forth in claim 1, wherein the control device is configured to stop, when an absolute value of a voltage in any one of the phases exceeds a threshold value in a state of all the circuit breakers on both sides being interrupted together, an update on the DC voltage component and the magnetic-flux DC-component, and to calculate, when a maximum value of the absolute value of the voltage continues in a state of being a threshold value or less for a predetermined time period, as a residual magnetic flux a total sum of converged values of the magnetic flux signal after the circuit breakers' interruption.

4. The residual magnetic flux measurement apparatus as set forth in claim 1, wherein the control device is configured to stop immediately, when contacts of the circuit breakers on both sides for any one of the phases of the three-phase transformer are interrupted together and an interruption mode is owing to a power-system fault, an update on the DC voltage component and the magnetic-flux DC-component.

5. The residual magnetic flux measurement apparatus as set forth in claim 1, wherein the control device is configured to restart, after calculating a total sum of the converged values as the residual magnetic flux, an update on the DC voltage component and the magnetic-flux DC-component.

* * * * *